United States Patent
Cho et al.

(10) Patent No.: US 9,448,356 B2
(45) Date of Patent: Sep. 20, 2016

(54) LIGHT-EMITTING DIODE (LED) PACKAGE INCLUDING MULTIPLE LEDS PER HOUSING AND DISPLAY DEVICE HAVING THE SAME AS LIGHT SOURCE

(71) Applicant: Samsung Display Co., Ltd., Yongin, Gyeonggi-Do (KR)

(72) Inventors: Joo Woan Cho, Seongnam-si (KR); Seok-Won Kang, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 42 days.

(21) Appl. No.: 14/315,103

(22) Filed: Jun. 25, 2014

(65) Prior Publication Data

US 2015/0153504 A1   Jun. 4, 2015

(30) Foreign Application Priority Data

Dec. 3, 2013 (KR) .................. 10-2013-0149218

(51) Int. Cl.
  *F21V 8/00* (2006.01)
  *H01L 33/60* (2010.01)
  *H01L 25/075* (2006.01)

(52) U.S. Cl.
  CPC ........... *G02B 6/0073* (2013.01); *G02B 6/0031* (2013.01); *G02B 6/0068* (2013.01); *G02B 6/0083* (2013.01); *H01L 25/0753* (2013.01); *H01L 33/60* (2013.01); *H01L 2224/48091* (2013.01); *H01L 2224/49113* (2013.01); *H01L 2933/0091* (2013.01)

(58) Field of Classification Search
  CPC  G02B 6/0068; G02B 6/0073; G02B 6/0031; G02B 6/0083; G02F 1/133615; H01L 25/0753; H01L 33/504; H01L 33/60
  USPC ................... 362/97.3, 600–606; 257/98
  See application file for complete search history.

(56) References Cited

U.S. PATENT DOCUMENTS

| 2003/0025117 A1 | 2/2003 | Isokawa et al. |
| 2005/0167682 A1 | 8/2005 | Fukasawa |

(Continued)

FOREIGN PATENT DOCUMENTS

| JP | 2001-155510 (A) | 6/2001 |
| JP | 2004-087973 (A) | 3/2004 |
| JP | 2005-019838 (A) | 1/2005 |
| JP | 2007-323885 (A) | 12/2007 |
| KR | 10-0609969 (B1) | 7/2006 |

(Continued)

OTHER PUBLICATIONS

Machine English translation of KR1020070103882 to Park.*

*Primary Examiner* — Anne Hines
(74) *Attorney, Agent, or Firm* — Knobbe, Martens, Olson & Bear, LLP

(57) ABSTRACT

A light-emitting diode (LED) package and a display device having the same are disclosed. In one aspect, the display device includes a display panel and a backlight assembly including a light-emitting diode (LED) package configured to output light via an opening and a light guide plate configured to guide the emitted light to the display panel. The LED package includes a housing having a light reflecting property and including a bottom portion, a sidewall portion connected to the bottom portion, and a cover portion connected to the sidewall portion, wherein the opening is defined in the sidewall portion and faces the light guide plate. The LED package also includes a plurality of LEDs accommodated in the housing, and wherein the LEDs are arranged in a first direction extending from the light guide plate to the opening.

39 Claims, 13 Drawing Sheets

(56) References Cited

U.S. PATENT DOCUMENTS

2006/0284203 A1 12/2006 Han et al.
2009/0114929 A1* 5/2009 Lee et al. .................. 257/88
2010/0213487 A1 8/2010 Kuo et al.
2011/0291114 A1* 12/2011 Cheng ...................... 257/88
2013/0141897 A1* 6/2013 Tang et al. ................ 362/97.3

FOREIGN PATENT DOCUMENTS

| KR | 10-0674871 (B1) | 1/2007 |
| KR | 10-2007-0103882 (A) | 10/2007 |
| WO | WO 2008139353 A1 * | 11/2008 |
| WO | WO 2013/085187 A1 | 6/2013 |

* cited by examiner

LIGHT-EMITTING DIODE (LED) PACKAGE INCLUDING MULTIPLE LEDS PER HOUSING AND DISPLAY DEVICE HAVING THE SAME AS LIGHT SOURCE

CROSS-REFERENCE TO RELATED APPLICATIONS

This U.S. non-provisional patent application claims priority under 35 U.S.C. §119 of Korean Patent Application No. 10-2013-0149218, filed on Dec. 3, 2013, the contents of which are hereby incorporated by reference.

BACKGROUND

1. Field

The described technology generally relates to a light-emitting diode (LED) package and a display device having the LED package as its light source.

2. Description of the Related Technology

Display devices such as liquid crystal displays (LCDs) include a backlight assembly and display images using light provided from the backlight assembly. Light-emitting diode (LED) packages are widely used as the light source of these backlight assemblies. LED packages have advantages over other light sources, such as low driving voltage, high luminance, etc. Accordingly, LED packages are widely used as light sources in various applications, e.g., in a display device, a normal lighting fixture, etc.

SUMMARY OF CERTAIN INVENTIVE ASPECTS

One inventive aspect is an LED package having improved color purity and increased light-emitting amount.

Another aspect is a display device having the LED package as its light source.

Another aspect is an LED package including a housing and a plurality of LEDs. The housing has a light reflection property. The LEDs are accommodated in the housing. The housing includes a bottom portion, a sidewall portion connected to the bottom portion, and a cover portion connected to the sidewall portion to cover the bottom portion A light exit part through which the light exits is defined in the sidewall portion and the LEDs are arranged in a direction from the light exit part to the sidewall portion facing the light exit part.

Another aspect is a display device including a display panel and a backlight assembly. The backlight assembly includes an LED package to emit a light and a light guide plate to guide the light to the display panel.

The LED package includes a housing and a plurality of LEDs. The housing has a light reflecting property and includes a bottom portion, a sidewall portion connected to the bottom portion, and a cover portion connected to the sidewall portion to cover the bottom portion. The LEDs are accommodated in the housing.

A light exit part through which the light exits is defined in the sidewall portion facing the light guide plate and the LEDs are arranged in a direction from the light exit part to the sidewall portion facing the light exit part.

Another aspect is a display device including a display panel and a backlight assembly including a light-emitting diode (LED) package configured to output light via an opening and a light guide plate configured to guide the emitted light to the display panel, wherein the LED package includes a housing having a light reflecting property and including a bottom portion, a sidewall portion connected to the bottom portion, and a cover portion connected to the sidewall portion, wherein the opening is defined in the sidewall portion and faces the light guide plate and a plurality of LEDs accommodated in the housing, and wherein the LEDs are arranged in a first direction extending from the light guide plate to the opening.

The housing is formed at least partially of a light reflecting material. The LED package further comprises a plurality of light scattering portions protruding from inner surfaces of the housing. The LED package further includes a plurality of lead frames placed on the bottom portion and electrically connected to the LEDs and an insulating layer formed inside the housing to cover at least one of the LEDs, wherein the insulating layer is formed at least partially of an insulating material and a fluorescent material. The insulating layer includes a plurality of insulating layers and the insulating layers are arranged in the first direction. The insulating layers include a first insulating layer covering a first LED and a second insulating layer covering a second LED, wherein at least one of the first or second insulating layer is formed at least partially of the insulating material and the fluorescent material.

The first insulating layer is formed at least partially of a first fluorescent material and the second insulating layer is formed at least partially of a second fluorescent material different from the first fluorescent material. The LED package further includes a plurality of light scattering portions formed at an interface between the first and second insulating layers and the light scattering portions protrude from a surface of at least one of the first and second insulating layers. The sidewall portion includes a first sidewall extending in the first direction, a second sidewall opposing the first sidewall, and a third sidewall connecting the first and second sidewalls, wherein the opening opposes the third sidewall. The bottom portion has a substantially rectangular shape having a pair of long sides and a pair of short sides, the first and second sidewalls are connected to the long sides of the bottom portion, and the third sidewall is connected to one of the short sides of the bottom portion.

Each of the first and second sidewalls has a height that increases in a direction extending away from the third sidewall. The cover portion is inclined toward the third sidewall. The cover portion is non-linear. The cover portion is curved away from the bottom portion. The cover portion is curved toward the bottom portion. An inner surface of at least one of the first to third sidewalls is inclined with respect to side surfaces of the LEDs. The third sidewall includes a plurality of inner surfaces, wherein each of the inner surfaces is inclined with respect to side surfaces of the LEDs, and wherein each of the inner surfaces has a different size.

An inner surface of the third sidewall extends in a second direction crossing the first direction and each side surface of the LEDs is inclined with respect to the second direction. The backlight assembly further includes a printed circuit board extending along at least one side of the light guide plate, wherein the LED package is placed on the printed circuit board, and wherein the opening opposes the at least one side of the light guide plate. Each of the LED packages are configured to combine the different colors of light emitted from the LEDs to output white light.

Another aspect is an LED package including a housing having a light reflection property and a plurality of LEDs accommodated in the housing, wherein the housing includes a bottom portion, a sidewall portion connected to the bottom portion, and a cover portion connected to the sidewall portion, wherein an opening is defined in the sidewall portion and faces the light guide plate, wherein the LEDs are configured to output light through the opening, and wherein the LEDs are arranged in a first direction from the opening to the sidewall portion opposing the opening.

The housing is formed at least partially of a light reflecting material. The LED package further includes a plurality of light scattering portions protruding from inner surfaces of the housing. The LED package further includes a plurality of lead frames placed on the bottom portion and electrically connected to the LEDs and an insulating layer formed inside the housing to cover at least one of the LEDs, wherein the insulating layer is formed at least partially of an insulating material and a fluorescent material. The sidewall portion includes a first sidewall extending in the first direction, a second sidewall opposing the first sidewall, and a third sidewall connecting the first and second sidewalls, wherein the opening opposes the third sidewall.

Each of the first and second sidewalls has a height that increases in a direction extending away from the third sidewall. The cover portion is inclined toward the third sidewall. The cover portion has a curved shape. The light output through the opening is white.

Another aspect is a display device including a display panel and a plurality of light-emitting diode (LED) packages configured to output light to the display panel via an opening, wherein each of the LED packages includes a housing, wherein the opening is defined in one side of the housing, a plurality of LEDs accommodated in the housing, wherein the LED package is configured to combine the different colors of light emitted from the LEDs so as to output white light, and a plurality of insulating layers respectively formed over the LEDs inside the housing. The LEDs are arranged in a first direction from the opening to another side that is defined in the housing to face the opening.

At least one of the insulating layers is formed of an insulating material and a fluorescent material. Each of the LEDs has a substantially cuboidal shape, wherein the housing includes a plurality of inner surfaces and wherein at least one of the inner surfaces forms an inclined angle with respect to one of the surfaces of the LEDs.

According to at least one embodiment, the light paths of the color lights emitted from the LEDs accommodated in the housing of the LED package may become random. Therefore, the color lights are more easily mixed with each other, so that the color purity of the light emitted from the LED package may be improved.

In addition, according to at least one embodiment, the lights emitted from the LED package may be prevented from being reflected repeatedly in the housing. Thus, the amount of the lights emitted from the LED package may be increased.

Further, according to at least one embodiment, the width of the light exit part corresponds to the short side of the housing rather than the long side of the housing. Accordingly, although the LEDs are arranged in the housing, the width of the light exit part is not increased regardless of the number of the LEDs arranged in the housing. As a result, when the LED packages are arranged along the side surface of the light guide plate, the number of the LED packages may be easily adjusted. Therefore, the amount of the light incident to the light guide plate may be sufficiently provided.

DETAILED DESCRIPTION OF CERTAIN INVENTIVE EMBODIMENTS

Figure 1A:
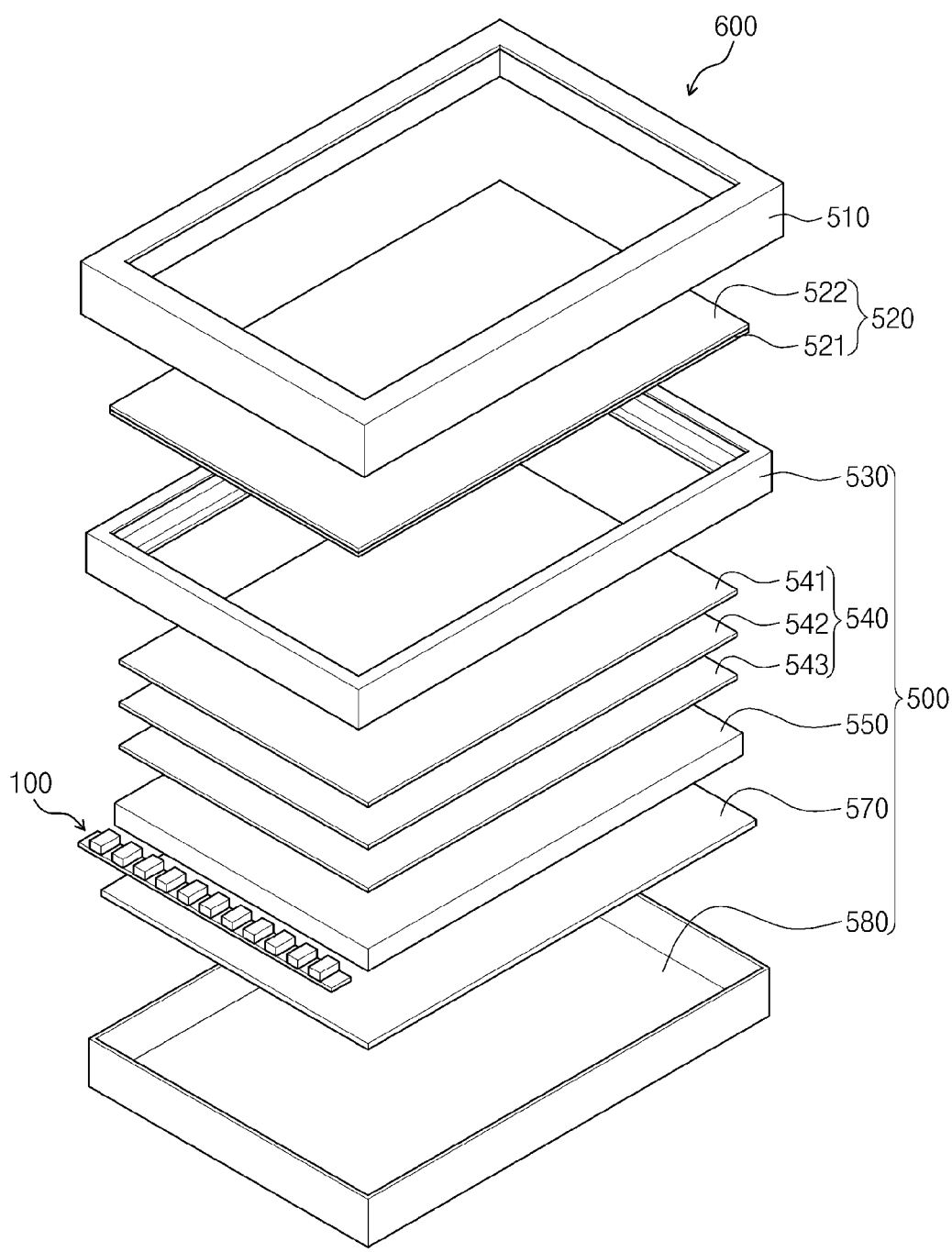
FIG. 1A is an exploded perspective view showing a display device according to an exemplary embodiment.

It will be understood that when an element or layer is referred to as being "on", "connected to" or "coupled to" another element or layer, it can be directly on, connected or coupled to the other element or layer or intervening elements or layers may also be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the described technology.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein are to be interpreted accordingly.

The terminology used herein is for the purpose of describing particular embodiments only and is not intended to be limiting of the disclosure. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the described technology will be explained in detail with reference to the accompanying drawings.

Figure 1B:
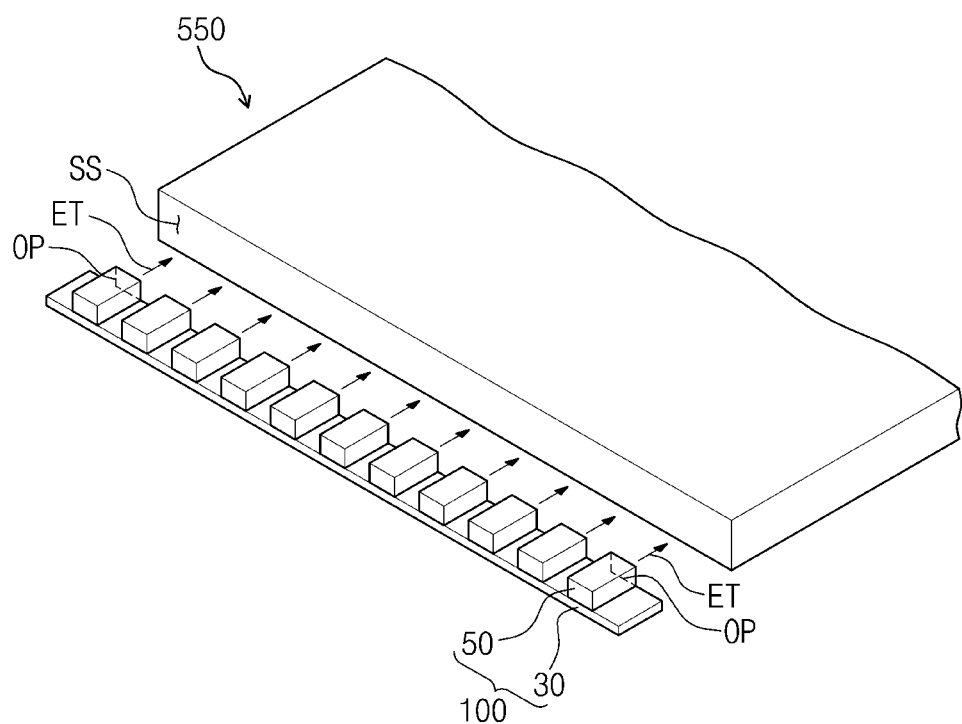
FIG. 1B is an enlarged view showing the light-emitting unit and the light guide plate shown in FIG. 1A.

FIG. 1A is an exploded perspective view showing a display device according to an exemplary embodiment. FIG. 1B is an enlarged view showing the light-emitting unit and the light guide plate shown in FIG. 1A.

Referring to FIGS. 1A and 1B, a display device 600 includes a backlight assembly 500 and a display panel 520. The backlight assembly 500 provides a light to the display panel 520 and the display panel 520 receives the light to display an image.

In the embodiment of FIG. 1, the display panel 520 is a liquid crystal display panel and the display panel 520 includes a display substrate 521, an opposite substrate 522, and a liquid crystal layer (not shown) interposed between the substrates 521 and 522. The display substrate 521 includes a plurality of pixel electrodes (not shown) respectively formed in a plurality of pixel areas and the opposite substrate 522 includes a common electrode (not shown) facing the pixel electrodes.

In the embodiment of FIG. 1, the display panel 520 is a liquid crystal display panel, however, the described technology is not limited thereto or thereby. For instance, the display panel 520 may be another type of display panel which receives a light from a backlight assembly to display an image, e.g., an electrophoretic display panel, an electrowetting display panel, etc.

In addition, the structure of the display panel 520 is not limited to the above described structure. For instance, according to another exemplary embodiment, the opposite substrate 522 does not include the common electrode and the display substrate 521 includes the common electrode formed thereon and spaced apart from the pixel electrodes.

The backlight assembly 500 includes a light-emitting unit 100, a receiving member 580, a reflection plate 570, a light guide plate 550, a mold frame 530, a plurality of sheets 540, and a cover member 510.

The light-emitting unit 100 generates light. The light-emitting unit 100 includes a printed circuit board 30 and a plurality of light-emitting diode (LED) packages 50. The LED packages 50 are mounted on the printed circuit board 30 and each of the LED packages 50 emits light ET to the light guide plate 550 through a light exit part or opening OP.

In the embodiment of FIG. 1, the printed circuit board 30 is placed at one side of the light guide plate 550 and extends along a side surface SS of the light guide plate 550. In addition, the light exit part OP of each LED package 50, through which the light ET is emitted, faces the side surface SS of the light guide plate 550 and the LED packages 50 are placed on the printed circuit board 30 along the side surface SS of the light guide plate 550. Thus, the emitted light ET is incident to the light guide plate 550 through the side surface SS of the light guide plate 550.

The LED packages 50 are arranged along the side surface SS in the embodiment of FIG. 1, however, the number and position of the LED packages 50 is not be limited thereto or thereby. For instance, the backlight assembly 500 may further include another plurality of LED packages, which are arranged along another side of the light guide plate 550, in addition to the LED packages 50. Also, according to another exemplary embodiment, one LED package is placed at a corner portion of the light guide plate 550, and in this embodiment, the one LED package is arranged to face a chamfered surface of the corner portion of the light guide plate 550.

The receiving member 580 accommodates the light-emitting unit 100, the reflection plate 570, and the light guide plate 550. The light guide plate 550 guides the light ET received from the light-emitting unit 100 to the display panel 520.

The reflection plate 570 includes a material reflecting the light, such as polyethylene terephthalate (PET) or aluminum and is placed between a bottom portion of the receiving member 580 and the light guide plate 550. The mold frame 530 extends along sidewalls of the receiving member 580 to be connected to the receiving member 580. The mold frame 530 fixes edges of the light guide plate 550 accommodated in the receiving member 580 to the bottom part and the sheets 540 and the display panel 520 are sequentially placed on the mold frame 530.

The sheets 540 are interposed between the display panel 520 and the light guide plate 550. In the FIG. 1 embodiment, the sheets 540 include a diffusion sheet 543 diffusing the light, a prism sheet 542 condensing the light to improve a front brightness of the display panel 520, and a protection sheet 541 protecting a rear surface of the display panel 520. The cover member 510 is connected to the receiving member 580. The cover member 510 covers edges of the display panel 520 and exposes a display area of the display panel 520, which is formed inside the edges, to the external environment.

In the embodiment of FIG. 1, except for the LED packages 50, the other elements of the backlight assembly 500 should not be limited to the above-mentioned structure. For instance, according to another exemplary embodiment, the reflection plate 570 is omitted in the backlight assembly 500 and the bottom portion of the receiving member 580 is coated with a reflection layer.

Hereinafter, the structure of the LED packages 50 will be described in detail with reference to FIGS. 2A to 2C.

Figure 2A:
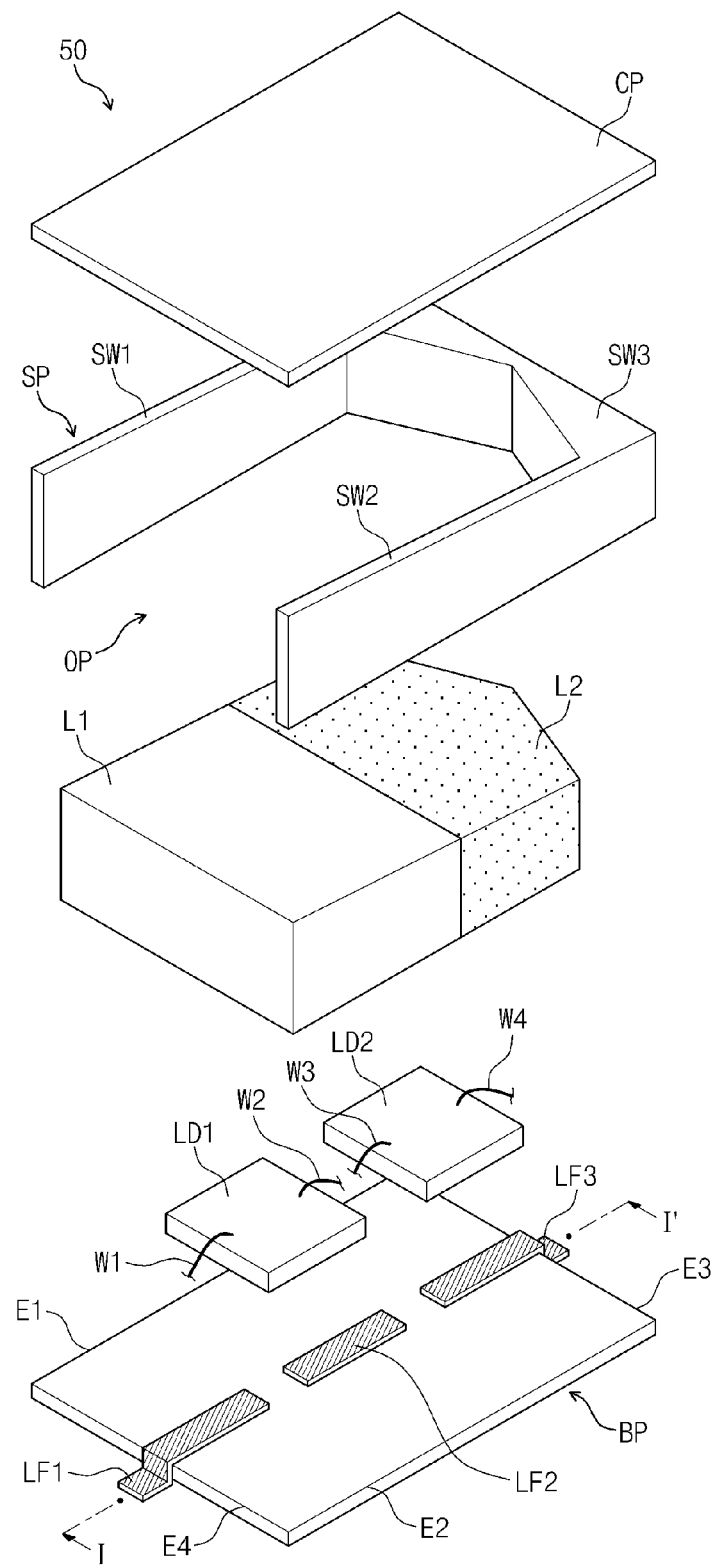
FIG. 2A is an exploded perspective view showing one LED package among LED packages shown in FIG. 1B.

FIG. 2A is an exploded perspective view showing one LED package of the LED packages shown in FIG. 1B. FIG. 2B is a cross-sectional view taken along line I-I' of FIG. 2A. FIG. 2C is a plan view showing the LED package shown in FIG. 2A. The structure of the LED package 50 shown in FIG. 1B will be described in detail as a representative example.

As shown in FIG. 2, the LED package 50 includes a housing MD, a first lead frame LF1, a second lead frame LF2, a third lead frame LF3, a first LED LD1, a second LED LD2, first to fourth wires W1 to W4, a first insulating layer L1, a second insulating layer L2, and a fluorescent substance FS. In some embodiments, each of the LEDs LD1 and LD2 has a substantially cuboidal shape.

The housing MD includes a light reflection material having an insulating property. For instance, the housing MD may include a polymer, such as polyethylene, polypropylene, polycarbonate, etc. Thus, the housing MD reflects the light emitted from the first and second LEDs LD1 and LD2, which are accommodated therein.

According to another exemplary embodiment, the housing MD includes a material having an insulating property and an inner surface of the housing MD is coated with a reflection layer, e.g., an aluminum layer. In this embodiment, the housing MD reflects the light emitted from the first and second LEDs LD1 and LD2 accommodated therein.

The housing MD includes a bottom portion BP, a sidewall portion SP, and a cover portion CP. In the FIG. 2 embodiment, the bottom portion BP is a plate with a rectangular shape and the bottom portion BP includes a first long side E1, a second long side E2, a first short side E3, and a second short side E4.

The sidewall portion SP is connected to the bottom portion BP. In the embodiment of FIG. 2, the sidewall portion SP includes a first sidewall SW1, a second sidewall SW2, and a third sidewall SW3. The first and second sidewalls SW1 and SW2 are formed with a one-to-one correspondence with the first and second long sides E1 and E2 and are connected to the bottom portion BP. Also, the third sidewall SW3 is formed with a one-to-one correspondence with the first short side E3 and is connected to the bottom portion BP. The third sidewall SW3 also connects the first and second sidewalls SW1 and SW2.

When a portion of the LED package 50, through which the light exits, is defined as the light exit part OP as described above, the light exit part OP is defined by a gap in the sidewall portion SP. More particularly, the light exit part OP is defined by the opening in the portion of the sidewall SP which faces the third sidewall SW3. Thus, the light emitted from the first and second LEDs LD1 and LD2 exits the LED package 50 through the light exit part OP.

The first to third lead frames LF1, LF2, and LF3 are placed on the bottom portion BP and a portion of the first to third lead frames LF1, LF2, and LF3 extends to the exterior of the housing MD. In detail, the first to third lead frames LF1, LF2, and LF3 are placed on the bottom portion BP substantially parallel to the first long side E1 and are spaced apart from each other. One end of the first lead frame LF1 extends to the exterior via one side of the housing MD and one end of the third lead frame LF3 extends to the exterior via another side of the housing MD. The one end of the first lead frame LF1 and the one end of the third lead frame LF3, which protrude from the housing MD, are electrically connected to power supply terminals (not shown) of the printed circuit board 30 shown in FIG. 1B.

The first and second LEDs LD1 and LD2 are accommodated in the housing MD and generate different colors of light from each other. In addition, the first and second LEDs LD1 and LD2 are arranged in a direction from the light exit part OP toward a part of the sidewall portion SP facing the light exit part OP in the housing MD. That is, since the third sidewall SW3 of the sidewall portion SP faces the light exit part OP, the first and second LEDs LD1 and LD2 are sequentially arranged in the direction toward the third sidewall SW3 from the light exit part OP.

In the embodiment of FIG. 2, since the direction from the light exit part OP to the third sidewall SW3 is substantially in parallel to the first and second long sides E1 and E2, the width of the light exit part OP corresponds to the length of the first short side E3 rather than the length of the first long side E1. Thus, even when the number of the LEDs placed in the housing MD increases, the width of the light exit part OP does not increase in proportion to the number of LEDs. Thus, when the LED packages 50 are arranged along the side surface SS (refer to FIG. 1B) of the light guide plate 550 (refer to FIG. 1B), the number of the LED packages 50 can be easily varied without changing the width of the light exit part OP, thereby securing a sufficient amount of light incident to the light guide plate 550.

The first to fourth wires W1 to W4 electrically connect the first and second LEDs LD1 and LD2 to the first to third lead frames LF1, LF2, and LF3. In the embodiment of FIG. 2, the first wire W1 electrically connects a positive terminal of the first LED LD1 to the first lead frame LF1 and the second wire W2 electrically connects a negative terminal of the first LED LD1 to the second lead frame LF2. In addition, the third wire W3 electrically connects a positive terminal of the second LED LD2 to the second lead frame LF2 and the fourth wire W4 electrically connects a negative terminal of the second LED LD2 to the third lead frame LF3.

As described above, when the first to second LEDs LD1 and LD2 are electrically connected to the first to third lead frames LF1, LF2, and LF3 by the first to fourth wires W1 to W4, the first and second LEDs LE1 and LD2 are electrically connected to each other in series. Therefore, when the one end of the first lead frame LF1 and the one end of the third lead frame LF3, which protrude from the housing MD, are connected to the power supply terminals of the printed circuit board in a one-to-one correspondence, the first and second LEDs LD1 and LD2 emit the light in response to a voltage applied through the power supply terminals.

Each of the first insulating layer L1 and the second insulating layer L2 includes an insulating material having a light transmitting property, e.g., silicon resin, epoxy resin, etc. In addition, the first insulating layer L1 is filled in the housing MD to cover the first LED LD1 and the second insulating layer L2 is filled in the housing MD to cover the second LED LD2.

That is, the first insulating layer L1 covers the first LED LD1 and the second insulating layer L2 covers the second LED LD2. Thus, the first and second insulating layers L1 and L2 are sequentially arranged from the light exit part OP to the third sidewall SW3.

According to some embodiments, the fluorescent substance FS is provided in the second insulating layer L2. In these embodiments, the fluorescent substance FS absorbs the light emitted from the second LED LD2, which is covered by the second insulating layer L2, and generates light having a different color from that of the light emitted from the second LED LD2. As a result, the light generated by the fluorescent substance FS is mixed with the light emitted from the first LED LD1 and emitted from the LED package 50 as the emitted light ET. The emitted light ET is emitted through the light exit part OP.

According to another exemplary embodiment, instead of the fluorescent substance FS, a quantum dot may be provided to the second insulating layer L2. In this embodiment, similar to the fluorescent substance FS, the quantum dot absorbs the light emitted from the second LED LD2 and generates a light having a different color from that of the light emitted from the second LED LD2.

In the FIG. 2 embodiment, the emitted light ET is white light and the first LED LD1 is a green LED emitting green light, the second LED LD2 is a blue LED emitting blue light, the blue light is changed to magenta light by the fluorescent substance FS, and the emitted light ET becomes white light through a mixture of the green light and the magenta light.

In the embodiment of FIG. 2, the first LED LD1, the second LED LD2, and the fluorescent substance FS are defined as described above, however, the described technology is not be limited thereto or thereby. For instance, the first LED LD1 may be a red LED emitting red light, the second LED LD2 may be the blue LED emitting blue light, the blue light is changed to cyan light by the fluorescent substance FS, and the emitted light ET becomes white light through a mixture of the red light and the cyan light.

As used below, an increase in amount of the light ET emitted through the light exit part OP is referred to as a first effect and an improvement in the color purity of the emitted light ET is referred to as a second effect. The housing MD has a structure described below in order to enhance the first and second effects while the emitted light ET is realized by mixing light emitted from the first and second LEDs LD1 and LD2 as described above.

As described above, the sidewall portion SP includes the first, second, and third sidewalls SW1, SW2, and SW3. The height of each of the first and second sidewalls SW1 and SW2 decreases as the distance of each of the first and second sidewalls SW1 and SW2 from the third sidewall SW3 decreases. Hereinafter, the structure of the first sidewall SW1 will be described below as a representative example. When the height of the first sidewall SW1 adjacent to the light exit part OP is defined as a first height H1 and the height of the first sidewall SW1 contacting the third sidewall SW3 is defined as a second height H2, the first height H1 is greater than the second height H2. In addition, the maximum height of the first sidewall SW1 is substantially the same as the first height H1, the minimum height of the first sidewall SW1 is substantially the same as the second height H2, and a height H3 of the third sidewall SW3 is substantially the same as the second height H2.

According to the structure of the first, second, and third sidewalls SW1, SW2, and SW3, the cover portion CP, which is connected to an upper portion of each of the first, second, and third sidewalls SW1, SW2, and SW3, has an inclined angle with respect to the third sidewall SW3. Thus, when viewed in a cross-sectional view, the cover portion CP has the inclined angle with respect to a first upper surface US1 of the first LED LD1 and to a second upper surface US2 of the second LED LD2.

Therefore, when light traveling in a normal direction from the first upper surface US1 is defined as a first light LT1, the first light LT1 is reflected by an inner surface of the cover portion CP and the reflected first light LT1 travels to the exterior of the LED package 50 through the light exit part OP having a first angle a1 with respect to the normal line.

In contrast to the embodiment of FIG. 2, when the cover portion CP is parallel to the first upper surface US1 without being inclined, the first light LT1 is repeatedly reflected between the inner surface of the cover portion CP and the first upper surface US1. As a result, the first light LT1 has difficulty in exiting from the light exit part OP toward the outside of the LED package 50. However, according to the embodiment of FIG. 2, the first light LT1 easily exits from the light exit part OP through the above-described light path without being reflected repeatedly between the inner surface of the cover portion CP and the first upper surface US1, thereby enhancing the first effect.

Similarly, when light traveling in a normal direction from the second upper surface US2 is defined as a second light LT2, the second light LT2 is reflected by the inner surface of the cover portion CP and travels to the exterior of the LED package 50 through the light exit part OP while having a second angle a2 with respect to the normal line. Thus, the second light LT2 easily exits from the light exit part OP along the light path shown in FIG. 2B without being reflected repeatedly between the inner surface of the cover portion CP and the second upper surface US2, thereby enhancing the first effect.

Figure 2B:
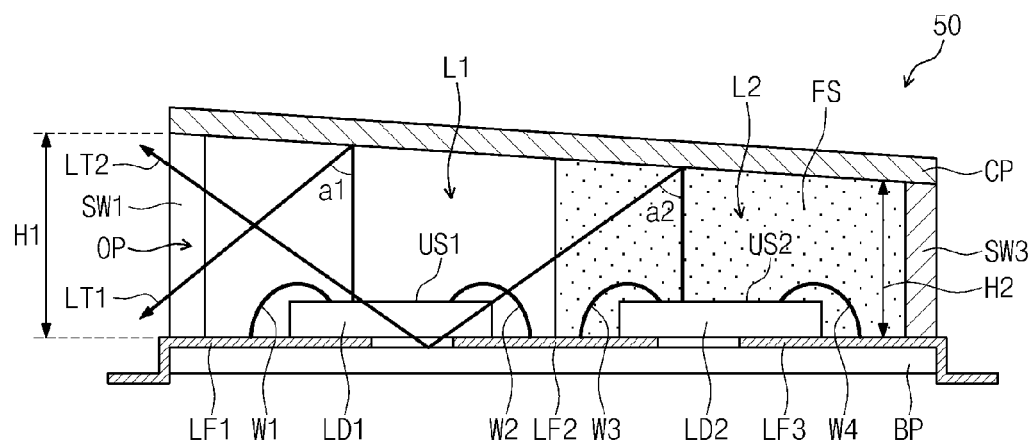
FIG. 2B is a cross-sectional view taken along line I-I' of FIG. 2A.
Figure 2C:
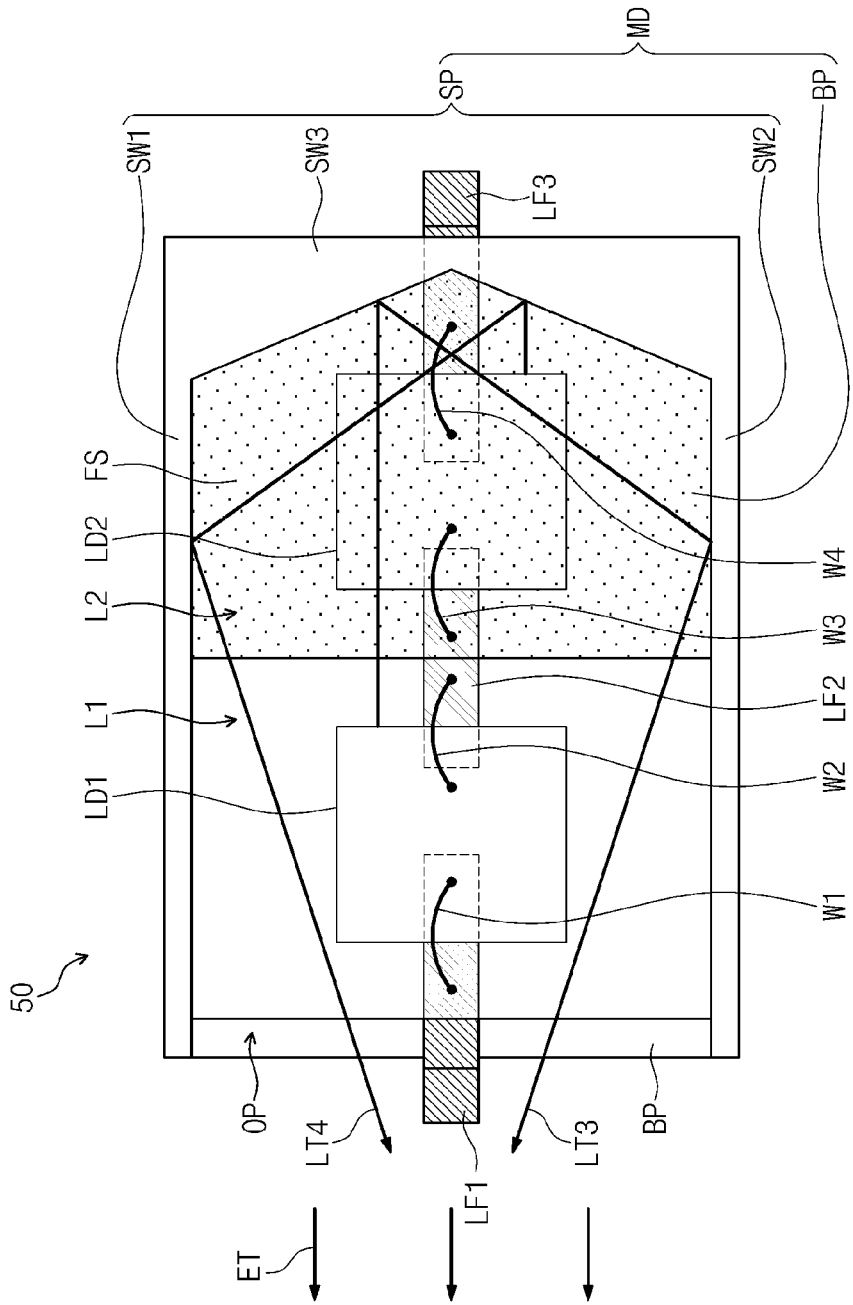
FIG. 2C is a plan view showing the LED package shown in FIG. 2A.

In addition, in the embodiment of FIG. 2, inner surfaces of the third sidewall SW3 are inclined with respect to side surfaces of the first and second LEDs LD1 and LD2. Thus, as shown in FIG. 2C, a third light LT3, which travels from the side surface of the first LED LD1 in a normal direction from the side surface of the first LED LD1, is prevented from being repeatedly reflected between the first LED LD1 and the third sidewall SW3. Similarly, a fourth light LT4, which travels from the side surface of the second LED LD2 in a normal direction from the side surface of the second LED LD2, is prevented from being repeatedly reflected between the second LED LD2 and the third sidewall SW3.

As a result, when considering the light paths of the third and fourth lights LT3 and LT4 reflected by the inclined inner surface of the third sidewall SW3, the third and fourth lights LT3 and LT4 are emitted through the light exit part OP, thereby enhancing the first effect.

In contrast to the embodiment of FIG. 2, when the light paths of the colored lights, which are emitted from the LEDs and have different colors from each other, are not controlled and the colored lights are directly emitted from the housing, the optical density in each colored light is concentrated at a predetermined radiation angle and the colored light may not be mixed properly, thereby causing deterioration in the color purity of the emitted light, which is realized by the mixture of the colored lights. However, according to the embodiment of FIG. 2, most of the colored lights emitted from the first and second LEDs LD1 and LD2 are reflected by the inner surfaces of the housing MD and travel in a random light path such that the colored lights may be easily mixed with each other. Furthermore, since the first and second LEDs LD1 and LD2 are sequentially arranged from the light exit part OP to the third sidewall SW3, light paths of most of the lights are overlapped after being emitted from the first and second LEDs LD1 and LD2, thereby enhancing the second effect.

Figure 3:
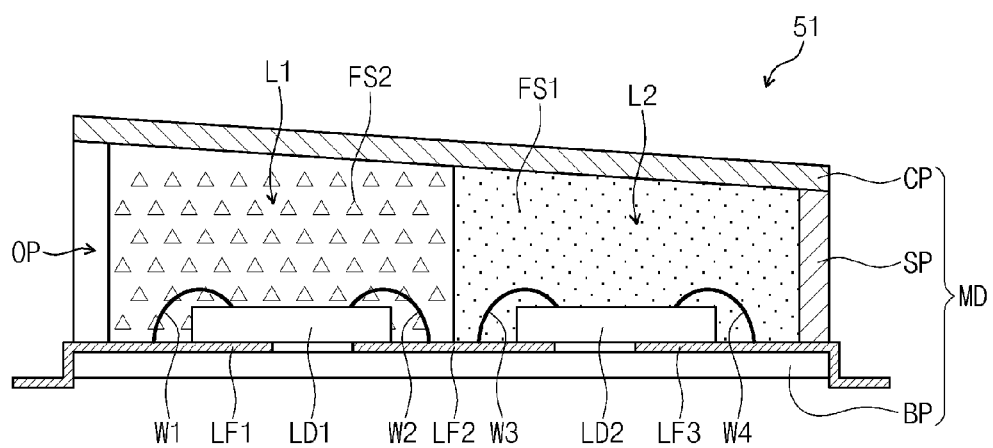
FIG. 3 is a cross-sectional view showing an LED package included in a backlight assembly of a display device according to another exemplary embodiment.

FIG. 3 is a cross-sectional view showing an LED package included in a backlight assembly of a display device according to another exemplary embodiment. In FIG. 3, the same reference numerals denote the same elements in previous figures, and thus the detailed descriptions of the same elements will be omitted.

When comparing the present exemplary embodiment shown in FIG. 3 with the exemplary embodiment shown in FIG. 2B, the LED package 51 includes a first fluorescent substance FS1 provided in a first insulating layer L1 and a second fluorescent substance FS2 provided in a second insulating layer L2 to emit white light through the light exit part OP.

In the embodiment of FIG. 3, a first LED LD1 and a second LED LD2 emit the same color, for example each of the first and the second LEDs LD1, LD2 is a blue LED emitting blue light. In this case, the blue light emitted from the first LED LD2 is changed to red light by the first fluorescent substance FS1, and the blue light emitted from the second LED LD1 is changed to cyan light by the second fluorescent substance FS2. Thus, the red light and the cyan light are mixed with each other, so that the emitted light ET1 becomes white light.

Figure 4:
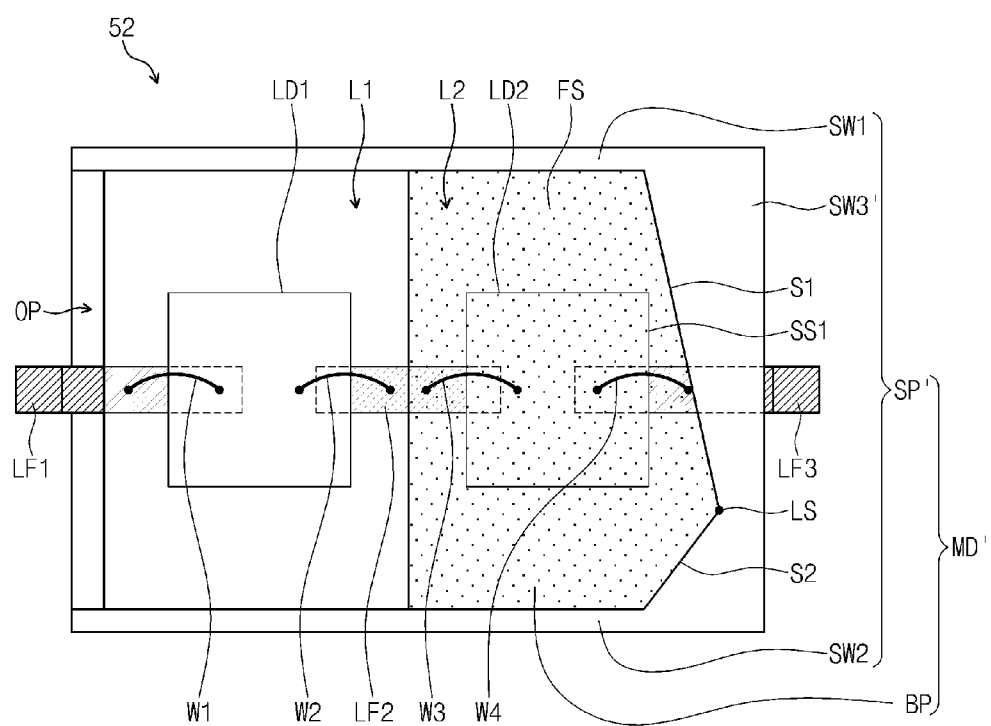
FIG. 4 is a plan view showing an LED package included in a backlight assembly of a display device according to another exemplary embodiment.

FIG. 4 is a plan view showing an LED package included in a backlight assembly of a display device according to another exemplary embodiment. In FIG. 4, the same reference numerals denote the same elements in previous figures, and thus the detailed descriptions of the same elements will be omitted.

Referring to FIG. 4, an LED package 52 includes a housing MD', and the housing MD' includes a sidewall portion SP', a bottom portion BP, and a cover portion (not shown). Hereinafter, the housing MD' of the present exemplary embodiment shown in FIG. 4 will be described in comparison with the housing MD of the exemplary embodiment shown in FIG. 2C.

Referring to FIG. 2C again, the third sidewall SW3 includes two inner surfaces and each of the two inner surfaces is inclined with respect to the side surfaces of the first LED LD1 and the second LED LD2. In addition, the two inner surfaces are symmetrical with respect to a horizontal line when viewed in a plan view and the two inner surfaces have the same size.

In the present exemplary embodiment shown in FIG. 4, a third sidewall SW3' includes a first inner surface S1 and a second inner surface S2 and each of the first and second inner surfaces S1 and S2 is inclined with respect to side surfaces of first and second LEDs LD1 and LD2. In addition, the first and second inner surfaces S1 and S2 are non-symmetrical with respect to a horizontal line when viewed in a plan view and the first inner surface S1 has a size different from that of the second inner surface S2.

Therefore, light emitted from a side surface SS1 of the second LED LD2 traveling in a normal direction from the side surface SS1, does not reach a boundary line LS at which the first inner surface S1 meets the second inner surface S2. Thus, the light is prevented from being repeatedly reflected between the side surface SS1 and the boundary line LS and the first effect of the described technology is enhanced.

Figure 5:
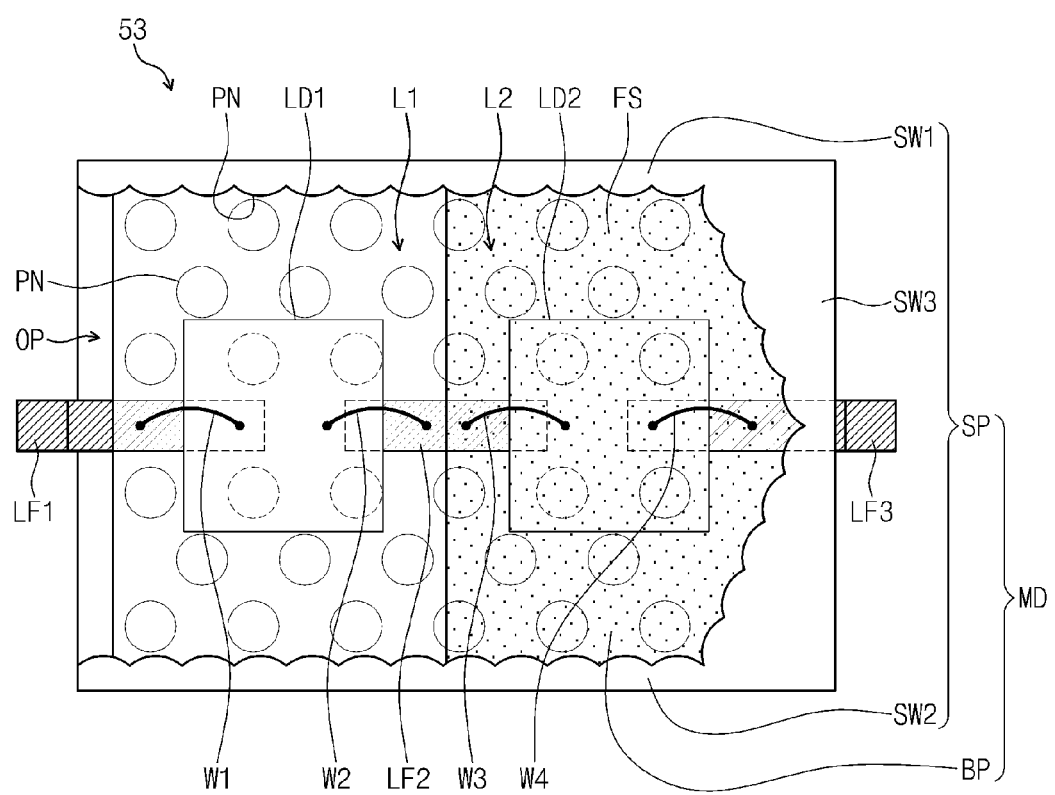
FIG. 5 is a plan view showing an LED package included in a backlight assembly of a display device according to another exemplary embodiment.

FIG. 5 is a plan view showing an LED package included in a backlight assembly of a display device according to another exemplary embodiment. In FIG. 5, the same reference numerals denote the same elements in previous figures, and thus the detailed descriptions of the same elements will be omitted.

Referring to FIG. 5, an LED package 53 includes a housing MD and the LED package 53 includes a plurality of light scattering portions PN formed on an inner surface of the housing MD. In detail, the housing MD includes a cover portion (not shown), a sidewall portion SP, and a bottom portion BP, and the light scattering portions PN are formed at inner surfaces of each of the cover portion, the sidewall portion SP, and the bottom portion BP. Also, each of the light scattering portions PN protrudes from the inner surface of the housing MD toward an inner space of the housing MD.

The light scattering portions PN scatter light emitted from a first LED LD1 and a second LED LD2. Therefore, the light paths of the emitted light emitted from the first and second LEDs LD1 and LD2 becomes more random, and thus the first effect and the second effect of the described technology are enhanced.

In the embodiment of FIG. 5, each of the light scattering portions PN has a hemispherical shape in a cross-sectional view, however, the shape of the light scattering portions PN should not be limited to the hemispherical shape. For instance, the light scattering portions PN may have a triangular shape or polygonal shape in a cross-sectional view.

Figure 6:
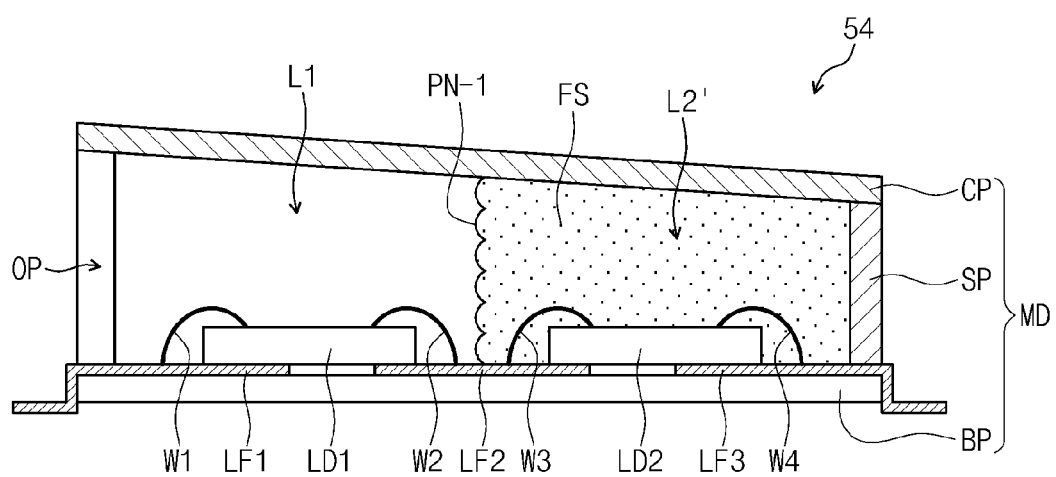
FIG. 6 is a cross-sectional view showing an LED package included in a backlight assembly of a display device according to another exemplary embodiment.

FIG. 6 is a cross-sectional view showing an LED package included in a backlight assembly of a display device according to another exemplary embodiment. In FIG. 6, the same reference numerals denote the same elements in previous figures, and thus the detailed descriptions of the same elements will be omitted.

Referring to FIG. 6, an LED package 54 includes a first insulating layer L1 and a second insulating layer L2' and the LED package 54 includes a plurality of light scattering portions PN-1 formed at the interface between the first insulating layer L1 and the second insulating layer L2'. In the embodiment of FIG. 6, each of the light scattering portions PN-1 protrudes from a surface of the second insulating layer L2' toward the first insulating layer L1.

Similar to the light scattering portions PN shown in FIG. 5, the light scattering portions PN-1 scatter light emitted from a first LED LD1 and a second LED LD2. Thus, the light paths of the light emitted from the first and second LEDs LD1 and LD2 becomes more random due to the light scattering portions PN-1, and thus the first and second effects of the described technology described earlier are enhanced.

In the embodiment of FIG. 6, each of the light scattering portions PN-1 has a hemispherical shape when viewed in a cross-sectional view, however, the shape of the light scattering portions PN-1 is not limited to the hemispherical shape. For instance, according to another exemplary embodiment, the light scattering portions PN-1 have a triangular shape, a polygonal shape, etc., when viewed in a cross-sectional view. Also, each of the light scattering portions PN-1 can protrude from a surface of the first insulating layer L1 toward the second insulating layer L2'.

Figure 7:
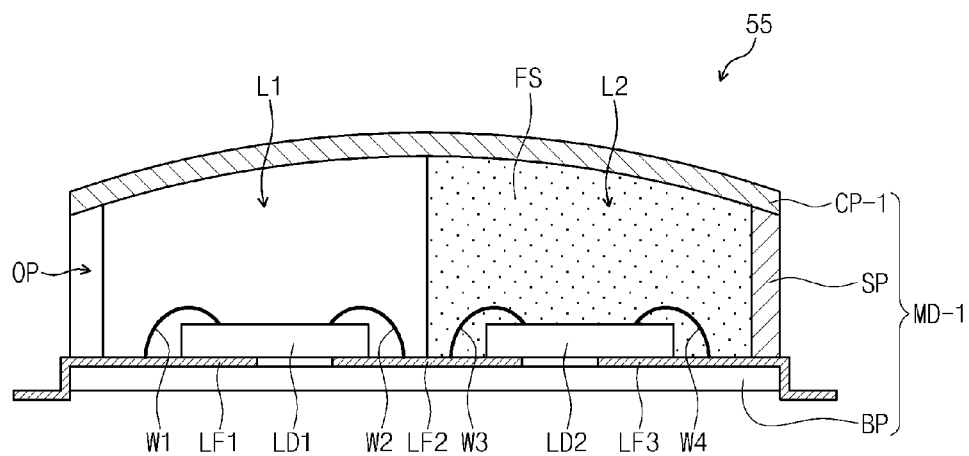
FIG. 7 is a cross-sectional view showing an LED package included in a backlight assembly of a display device according to yet another exemplary embodiment.

FIG. 7 is a cross-sectional view showing an LED package included in a backlight assembly of a display device according to another exemplary embodiment. In FIG. 7, the same reference numerals denote the same elements in previous figures, and thus the detailed descriptions of the same elements will be omitted.

Referring to FIG. 7, an LED package 55 includes a housing MD-1 and the housing MD-1 includes a cover portion CP-1 having a curved shape. Thus, an inner surface of the cover portion CP-1 has a curvature. When the cover portion CP-1 has the curved shape, an upper surface of each of first and second LEDs LD1 and LD2 is not parallel to the inner surface of the cover portion CP-1. Thus, light emitted from the first and second LEDs LD1 and LD2 and traveling in a normal direction with respect to the upper surface is prevented from being repeatedly reflected between the upper surface of the first and second LEDs LD1 and LD2 and the inner surface of the cover portion CP-1.

Figure 8:
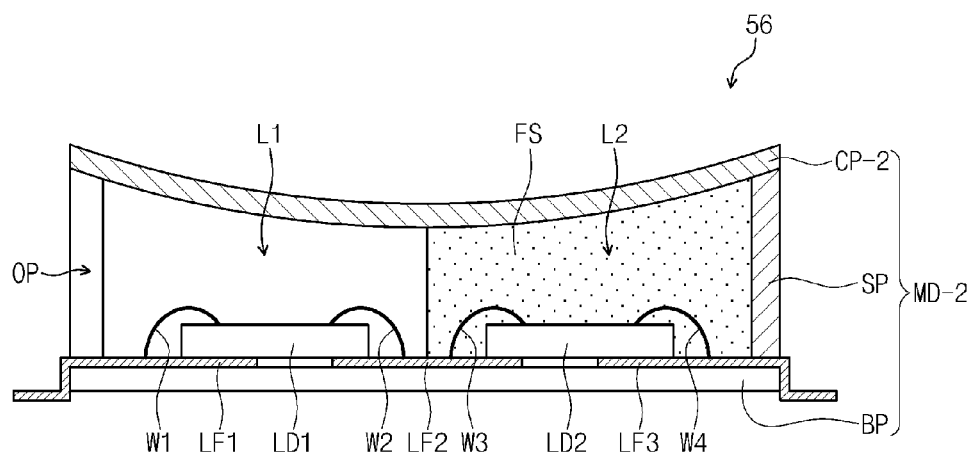
FIG. 8 is a cross-sectional view showing an LED package included in a backlight assembly of a display device according to another exemplary embodiment.

FIG. 8 is a cross-sectional view showing an LED package included in a backlight assembly of a display device according to another exemplary embodiment. In FIG. 8, the same reference numerals denote the same elements in previous figures, and thus the detailed descriptions of the same elements will be omitted.

Referring to FIG. 8, an LED package 56 includes a housing MD-2 and the housing MD-2 includes a cover portion CP-2 having a curved shape.

According to the exemplary embodiment shown in FIG. 7, the cover portion CP-1 (refer to FIG. 7) has a convex arc shape facing the exterior of the LED package 55 (refer to FIG. 7), however, the cover portion CP-2 has a convex arc shape facing the inside of the LED package 56 in the embodiment shown in FIG. 8.

Thus, similar to the exemplary embodiment shown in FIG. 7, an upper surface of each of first and second LEDs LD1 and LD2 is not parallel to an inner surface of the cover portion CP-2. Thus, light emitted from the first and second LEDs LD1 and LD2 and traveling in a normal direction with respect to the upper surface of the first and second LEDs LD1 and LD2 is prevented from being repeatedly reflected between the upper surface of the first and second LEDs LD1 and LD2 and the inner surface of the cover portion CP-2.

Figure 9:
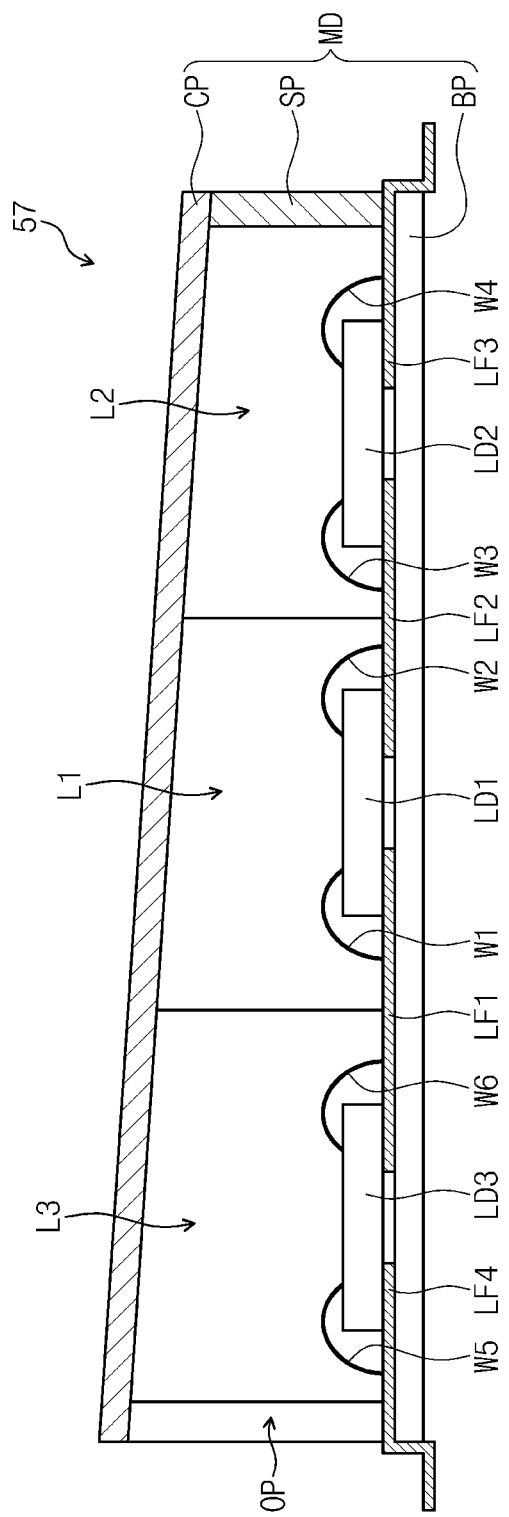
FIG. 9 is a cross-sectional view showing an LED package included in a backlight assembly of a display device according to still another exemplary embodiment.

FIG. 9 is a cross-sectional view showing an LED package included in a backlight assembly of a display device according to another exemplary embodiment. In FIG. 9, the same reference numerals denote the same elements in previous figures, and thus the detailed descriptions of the same elements will be omitted.

Referring to FIG. 9, an LED package 57 further includes a third LED LD3, a fourth lead frame LF4, a fifth wire W5, a sixth wire W6, and a third insulating layer L3.

The fourth lead frame LF4 and the fifth wire W5 electrically connect the third LED LD3 to first and second LEDs LD1 and LD2 in series. In addition, the third, first, and second LEDs LD3, LD1, and LD2 are sequentially arranged in a direction from a light exit part OP to a third sidewall SW3 (refer to FIG. 2C) of a sidewall portion SP and first to third insulating layers L1, L2, and L3 are arranged in the same way as the third, first, and second LEDs LD3, LD1, and LD2.

In the present exemplary embodiment, the color of light emitted through the light exit part OP is determined when the lights, which are emitted from the first to third LEDs LD1, LD2, and LD3, are mixed. For instance, the first LED LD1 is a green LED emitting green light, the second LED LD2 is a blue LED emitting blue light, and the third LED LD3 is a red LED emitting red light. Thus, when the lights emitted from the first to third LEDs LD1, LD2, and LD3 are mixed, white light is emitted through the light exit part OP.

Figure 10:
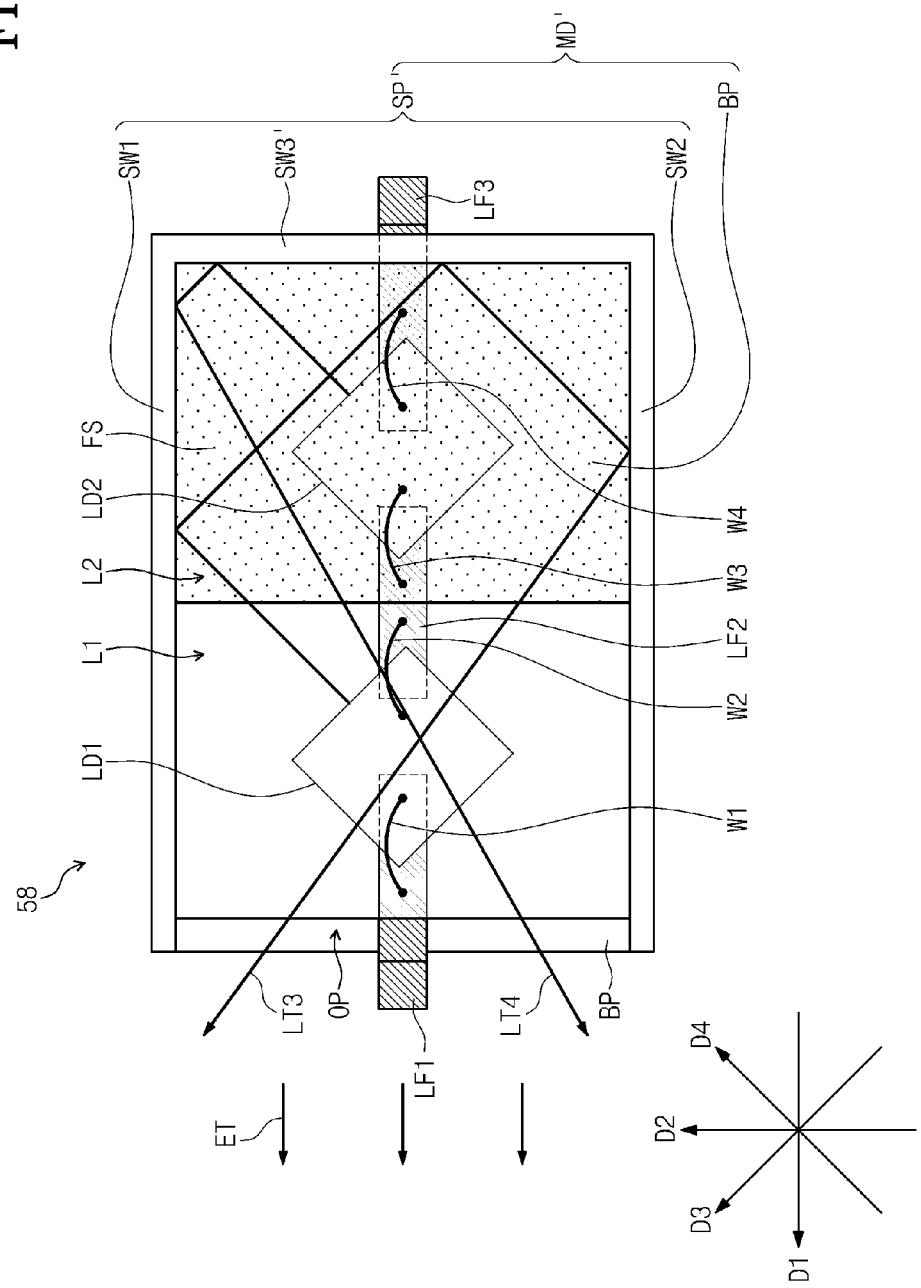
FIG. 10 is a plan view showing an LED package included in a backlight assembly of a display device according to another exemplary embodiment.

FIG. 10 is a plan view showing an LED package included in a backlight assembly of a display device according to another exemplary embodiment. In FIG. 10, the same reference numerals denote the same elements in previous figures, and thus the detailed descriptions of the same elements will be omitted.

Referring to FIG. 10, a housing MD' of an LED package 58 according to the present exemplary embodiment includes a sidewall portion SP' and the sidewall portion SP' includes a first sidewall SW1, a second sidewall SW2, and a third sidewall SW3'. A first LED LD1 and a second LED LD2 are arranged in a direction opposite to a first direction D1 in the housing MD'.

The third sidewall SW3 shown in FIG. 2C includes the inner surfaces arranged in directions that cross each other in a plan view. However, the third sidewall SW3' according to the present exemplary embodiment shown in FIG. 10 is substantially parallel to a second direction D2, which is substantially perpendicular to the first direction D1 when viewed in a plan view. That is, the third sidewall SW3' has a flat plate shape.

In addition, side surfaces of each of the first and second LEDs LD1 and LD2 are inclined with respect to the third sidewall SW3' when viewed in a plan view. That is, among four side surfaces of the first LED LD1, two side surfaces of the first LED LD1 are arranged substantially parallel to a third direction D3 crossing the second direction D2 and the other two side surfaces of the first LED LD1 are arranged substantially parallel to a fourth direction D4 crossing the second direction D2.

In the present exemplary embodiment, depending on the arrangement of the first and second LEDs LD1 and LD2 with respect to the third sidewall SW3', a first effect, which is defined as the increase in amount of the emitted light ET from the light exit part OP, and a second effect, which is defined as the improvement in the color purity of the emitted light ET, may be enhanced.

Figure 11:
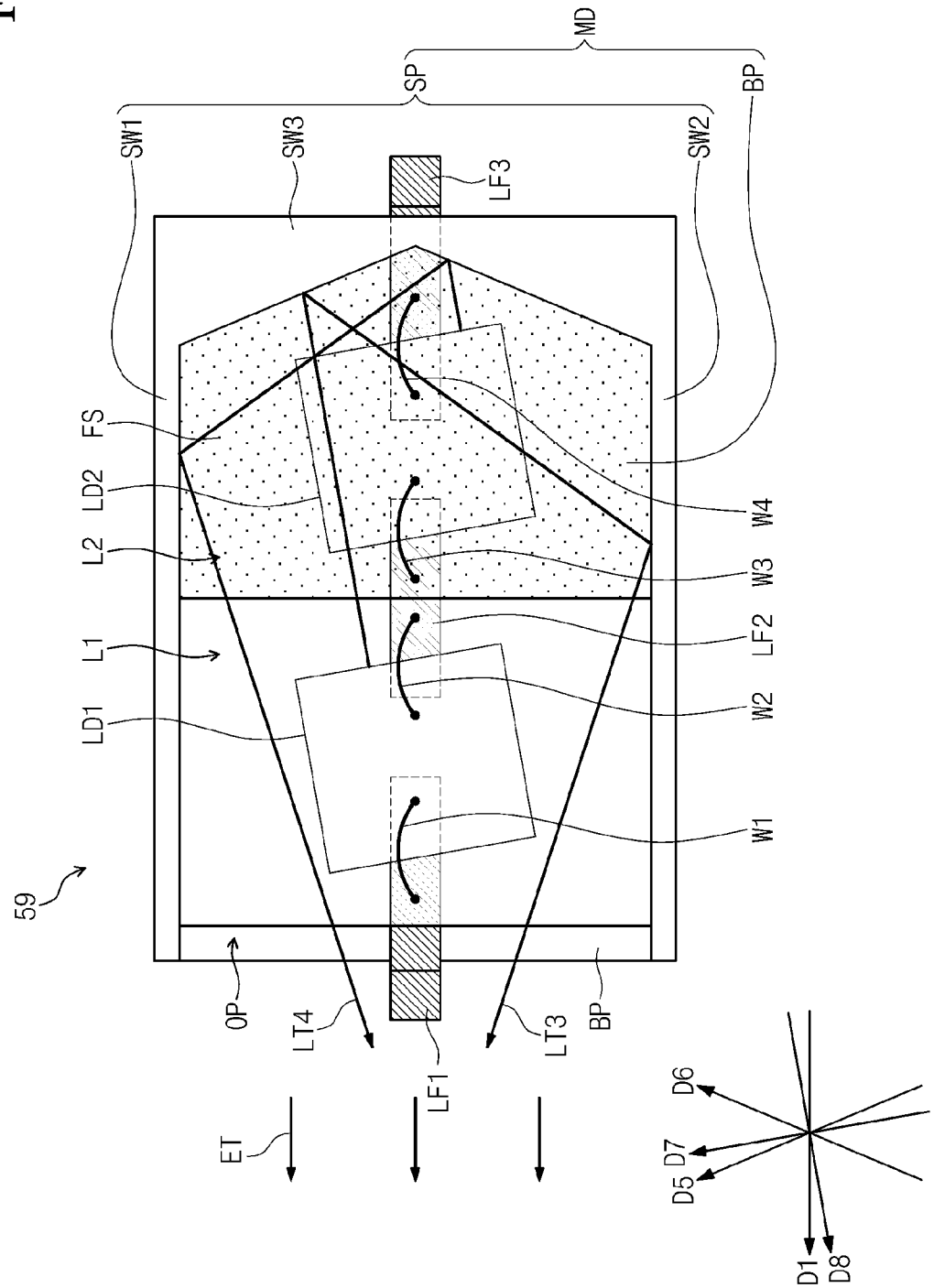
FIG. 11 is a plan view showing an LED package included in a backlight assembly of a display device according to another exemplary embodiment.

FIG. 11 is a plan view showing an LED package included in a backlight assembly of a display device according to another exemplary embodiment. In FIG. 11, the same reference numerals denote the same elements in previous figures, and thus the detailed descriptions of the same elements will be omitted.

Referring to FIG. 11, an LED package 59 includes a housing MD and a first LED LD1 and a second LED LD2, which are arranged in a direction opposite to a first direction D1 inside the housing MD.

In the embodiment of FIG. 11, side surfaces of each of the first and second LEDs LD1 and LD2 are inclined with respect to inner surfaces of third sidewall SW3 when viewed in a plan view. Furthermore, the side surfaces of each of the first and second LEDs LD1 and LD2 are inclined with respect to an inner surface of each of first and second sidewalls SW1 and SW2.

More particularly, when the inner surface of each of the first and second sidewalls SW1 and SW2 is arranged parallel to a first direction D1, one inner surface of the third sidewall SW3 is arranged parallel to a fifth direction D5, and the other inner surface of the third sidewall SW3 is arranged parallel to a sixth direction D6 when viewed in a plan view. Each of the side surfaces of the first and second LEDs LD1 and LD2 is arranged parallel to different directions from the first, fifth, and sixth directions D1, D5, and D6. That is, two side surfaces facing each other among four side surfaces of the first LED LD1 are arranged parallel to a seventh direction D7, the other two side surfaces among the four side surfaces of the first LED LD1 are arranged parallel to an eighth direction D8. The first, fifth, sixth, seventh, and eighth directions D1, D5, D6, D7, and D8 cross each other when viewed in a plan view.

In the present exemplary embodiment, depending on the arrangement of the first and second LEDs LD1 and LD2 with respect to the first to third sidewalls SW1, SW2, and SW3, a first effect, which is defined as the increase in amount of light ET emitted through the light exit part OP, and a second effect, which is defined as the improvement in the color purity of the emitted light ET, may be enhanced.

Although the exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A display device, comprising:
a display panel; and
a backlight assembly comprising i) a light-emitting diode (LED) package configured to output light via an opening and ii) a light guide plate configured to guide the emitted light to the display panel,
wherein the LED package comprises:
a housing having a light reflecting property and comprising i) a bottom portion, ii) a sidewall portion connected to the bottom portion, and iii) a cover portion connected to the sidewall portion, wherein the opening is defined in the sidewall portion and faces the light guide plate; and a plurality of LEDs accommodated in the housing,
wherein the LEDs are arranged in a first direction extending from the light guide plate to the opening,
wherein the sidewall portion comprises:
a first sidewall extending in the first direction;
a second sidewall opposing the first sidewall; and
a third sidewall connecting the first and second sidewalls and opposing the opening, and
wherein at least one inner surface of the third sidewall is inclined with respect to side surfaces of at least one of the LEDs when viewed in a plan view.

2. The display device of claim 1, wherein the housing is formed at least partially of a light reflecting material.

3. The display device of claim 1, wherein the LED package further comprises a plurality of light scattering portions protruding from inner surfaces of the housing.

4. The display device of claim 1, wherein the LED package further comprises:
a plurality of lead frames placed on the bottom portion and electrically connected to the LEDs; and
an insulating layer formed inside the housing to cover at least one of the LEDs,
wherein the insulating layer is formed at least partially of an insulating material and a fluorescent material.

5. The display device of claim 4, wherein the insulating layer comprises a plurality of insulating layers and wherein the insulating layers are arranged in the first direction.

6. The display device of claim 5, wherein the insulating layers comprise:
a first insulating layer covering a first LED; and
a second insulating layer covering a second LED,
wherein at least one of the first or second insulating layer is formed at least partially of the insulating material and the fluorescent material.

7. The display device of claim 6, wherein the first insulating layer is formed at least partially of a first fluorescent material and wherein the second insulating layer is formed at least partially of a second fluorescent material different from the first fluorescent material.

8. The display device of claim 6, wherein the LED package further comprises a plurality of light scattering portions formed at an interface between the first and second insulating layers and wherein the light scattering portions protrude from a surface of at least one of the first and second insulating layers.

9. The display device of claim 1, wherein the bottom portion has a substantially rectangular shape having a pair of long sides and a pair of short sides, wherein the first and second sidewalls are connected to the long sides of the bottom portion, and wherein the third sidewall is connected to one of the short sides of the bottom portion.

10. The display device of claim 9, wherein each of the first and second sidewalls has a height that increases in a direction extending away from the third sidewall.

11. The display device of claim 10, wherein the cover portion is inclined toward the third sidewall.

12. The display device of claim 9, wherein the cover portion is non-linear.

13. The display device of claim 12, wherein the cover portion is curved away from the bottom portion.

14. The display device of claim 12, wherein the cover portion is curved toward the bottom portion.

15. The display device of claim 1, wherein the third sidewall comprises a plurality of inner surfaces, wherein each of the inner surfaces is inclined with respect to side surfaces of the LEDs when viewed in a plan view, and wherein the inner surfaces have different sizes from each other.

16. The display device of claim 1, wherein the at least one inner surface of the third sidewall extends in a second direction crossing the first direction and wherein each side surface of the LEDs is inclined with respect to the second direction.

17. The display device of claim 1, wherein the backlight assembly further comprises a printed circuit board extending along at least one side of the light guide plate, wherein the LED package is placed on the printed circuit board, and wherein the opening opposes the at least one side of the light guide plate.

18. The display device of claim 1, wherein at least two of the LEDs are configured to emit different colors different from each other, and each of the LED packages are configured to combine the different colors of light emitted from the LEDs to output white light.

19. The LED package of claim 1, wherein the LEDs are configured to emit the same color.

20. A light-emitting diode (LED) package comprising:
a housing having a light reflection property; and
a plurality of LEDs accommodated in the housing,
wherein the housing comprises i) a bottom portion, ii) a sidewall portion connected to the bottom portion, and ii) a cover portion connected to the sidewall portion,
wherein an opening is defined in the sidewall portion and faces the light guide plate,
wherein the LEDs are configured to output light through the opening,
wherein the LEDs are arranged in a first direction from the opening to the sidewall portion opposing the opening,
wherein the sidewall portion comprises:
a first sidewall extending in the first direction;
a second sidewall opposing the first sidewall; and
a third sidewall connecting the first and second sidewalls and opposing the opening, and
wherein at least one inner surface of the third sidewall is inclined with respect to side surfaces of at least one of the LEDs when viewed in a plan view.

21. The LED package of claim 20, wherein the housing is formed at least partially of a light reflecting material.

22. The LED package of claim 20, further comprising a plurality of light scattering portions protruding from inner surfaces of the housing.

23. The LED package of claim 20, further comprising:
a plurality of lead frames placed on the bottom portion and electrically connected to the LEDs; and
an insulating layer formed inside the housing to cover at least one of the LEDs,
wherein the insulating layer is formed at least partially of an insulating material and a fluorescent material.

24. The light emitting diode package of claim 23, wherein the insulating layer is provided in a plural number, the insulating layers comprise:
a first insulating layer covering one light emitting diode of the light emitting diodes; and
a second insulating layer covering another light emitting diode of the light emitting diodes, and the first and second insulating layers are arranged in a direction in which the light emitting diodes are arranged in the housing.

25. The light emitting diode package of claim 24, wherein the fluorescent substance is disposed in at least one of the first and second insulating layers.

26. The light emitting diode package of claim 24, wherein the light emitting diode package further comprises a plurality of light scattering portions disposed at an interface between the first insulating layer and the second insulating layer and protruded from a surface of at least one of the first insulating layer and the second insulating layer.

27. The LED package of claim 20, wherein each of the first and second sidewalls has a height that increases in a direction extending away from the third sidewall.

28. The LED package of claim 20, wherein the cover portion is inclined toward the third sidewall.

29. The LED package of claim 20, wherein the cover portion has a curved shape.

30. The light emitting diode package of claim 20, wherein the third sidewall comprises a plurality of inner surfaces, each of the inner surfaces is inclined with respect to side surfaces of the LEDs when viewed in a plan view, and the inner surfaces have different sizes from each other.

31. The light emitting diode package of claim 20, wherein an inner surface of the third sidewall is disposed substantially in parallel to one direction and each of side surfaces of the LEDs is inclined with respect to the at least one inner surface of the third sidewall when viewed in a plan view.

32. The LED package of claim 20, wherein the light output through the opening is white.

33. The LED package of claim 20, wherein at least two of the LEDs are configured to emit colors different from each other.

34. The LED package of claim 20, wherein the LEDs are configured to emit the same color.

35. A display device, comprising:
a display panel; and
a plurality of light-emitting diode (LED) packages configured to output light to the display panel via an opening,
wherein each of the LED packages comprises:
a housing, wherein the opening is defined in one side of the housing;
a plurality of LEDs accommodated in the housing, and wherein the LEDs are arranged in a first direction from the opening to another side that is defined in the housing to face the opening; and
a plurality of insulating layers respectively formed over the LEDs inside the housing,
wherein at least two of the insulating layers have different optical properties arranged in the first direction.

36. The display device of claim 35, wherein at least one of the insulating layers is formed of an insulating material and a fluorescent material.

37. The display device of claim 35, wherein each of the LEDs has a substantially cuboidal shape, wherein the housing comprises a plurality of inner surfaces, and wherein at least one of the inner surfaces forms an inclined angle with respect to one of the surfaces of the LEDs from a top plan view perspective.

38. The display device of claim 35, wherein at least two of the LEDs are configured to emit different colors, and the LED package is configured to combine the different colors of light emitted from the LEDs so as to output white light.

39. The display device of claim 35, wherein the LEDs are configured to emit the same color.

* * * * *